(12) United States Patent
Wang et al.

(10) Patent No.: US 10,672,568 B2
(45) Date of Patent: Jun. 2, 2020

(54) FLEXIBLE PRESSURE SWITCH

(71) Applicant: Zhuhai AdvanPro Technology Co., Ltd, Zhuhai, Guangdong (CN)

(72) Inventors: Yangyong Wang, Guangdong (CN); Hanze Ye, Guangdong (CN); Zhongzhong Zhang, Guangdong (CN); Fei Wang, Guangdong (CN)

(73) Assignee: Zhuhai AdvanPro Technology Co., Ltd, Zhuhai (CN)

( * ) Notice: Subject to any disclaimer, the term of this patent is extended or adjusted under 35 U.S.C. 154(b) by 0 days.

(21) Appl. No.: 15/809,451

(22) Filed: Nov. 10, 2017

(65) Prior Publication Data

US 2018/0144882 A1 May 24, 2018

(30) Foreign Application Priority Data

Nov. 22, 2016 (CN) .......................... 2016 1 1046211

(51) Int. Cl.
| | |
|---|---|
| *H01H 13/14* | (2006.01) |
| *H01H 13/50* | (2006.01) |
| *H01H 11/00* | (2006.01) |
| *H05K 1/02* | (2006.01) |
| *H01H 1/40* | (2006.01) |
| *H05K 1/11* | (2006.01) |
| *H01H 11/06* | (2006.01) |

(52) U.S. Cl.
CPC .............. *H01H 13/14* (2013.01); *H01H 1/40* (2013.01); *H01H 11/00* (2013.01); *H01H 13/50* (2013.01); *H05K 1/028* (2013.01); *H05K 1/118* (2013.01); *H01H 2011/065* (2013.01); *H01H 2207/026* (2013.01); *H05K 2201/0314* (2013.01); *H05K 2201/10053* (2013.01)

(58) Field of Classification Search
CPC ........ H01H 13/14; H01H 13/50; H01H 11/00; H01H 2207/026; H05K 1/118; H05K 1/028; H05K 2201/0314; H05K 2201/10053
USPC ........................................................ 200/292
See application file for complete search history.

(56) References Cited

U.S. PATENT DOCUMENTS

| | | | | |
|---|---|---|---|---|
| 6,670,750 | B2 * | 12/2003 | Hanahara ............. | H01H 13/702 200/513 |
| 7,538,286 | B2 * | 5/2009 | Yoshioka ............. | H01H 13/705 200/341 |
| 8,841,568 | B2 * | 9/2014 | Dai ........................ | H01H 13/86 200/292 |

(Continued)

*Primary Examiner* — Edwin A. Leon
*Assistant Examiner* — Lheiren Mae A Caroc

(57) ABSTRACT

The disclosure provides a flexible pressure switch. A flexible electrode region and a flexible non-electrode region are formed on a flexible printed circuit board at the bottom layer of the flexible pressure switch, two flexible electrodes separated from each other are arranged in the flexible electrode region, a conductive elastic composite body is adhered to and located on the flexible non-electrode region through an elastic adhesion layer, a pressure contact cavity region directly facing the flexible electrode region is formed on the conductive elastic composite body, and an upper surface of the inner wall of the pressure contact cavity region can contact the two flexible electrodes simultaneously or successively so as to switch on the circuit when being pressed. The flexible pressure switch is simple in fabrication process, low in cost, stable in performance and suitable for mass production.

8 Claims, 3 Drawing Sheets

(56) References Cited

U.S. PATENT DOCUMENTS

2016/0042890 A1\* 2/2016 Lin ........................ H01H 13/83
200/5 A

\* cited by examiner (i)

(j)

(k)

(l)

(m)

(n)

FLEXIBLE PRESSURE SWITCH

CROSS-REFERENCE TO RELATED APPLICATION

The present application claims priority to Chinese patent application No. 201611046211.4 filed on Nov. 22, 2016, the whole disclosure of which is incorporated herein by reference.

TECHNICAL FIELD

The disclosure relates to a switch device, and in particular to a flexible pressure switch, belonging to the technical field of smart and wearable electronics.

BACKGROUND

Traditional pressure sensors have larger size and high rigidity, which limit the usage on any two flexible or flexible-rigid contact surfaces; this limitation is particularly obvious in the flexible and smart wearing field, that is, traditional pressure sensors cannot simultaneously meet the functionality and wearing comfort of smart and wearable products. In order to overcome the above limitation and to acquire pressure distribution directly or indirectly related to human body surfaces, it is necessary to develop a flexible pressure switch which is able to meet simultaneously the functionality and wearing comfort of products, and is simple in fabrication process, low in cost, stable in performance and suitable for mass production, etc.

SUMMARY

In order to solve the above technical problems, the disclosure provides a flexible pressure switch, which is simple in fabrication process, low in cost, stable in performance and suitable for mass production, and is able to meet simultaneously the functionality and wearing comfort of products.

The technical scheme of the disclosure is as follows.

A flexible pressure switch includes a flexible printed circuit board, an elastic adhesion layer and a conductive elastic composite body and they are arranged in a cascading manner from the bottom layer to the top layer in sequence, wherein the flexible printed circuit board is composed of a flexible electrode region and a flexible non-electrode region, two flexible electrodes separated from each other are arranged in the flexible electrode region, and the flexible electrode region adjusts the ON/OFF resistance threshold of the flexible pressure switch through an adjustable resistivity or an adjustable flexible electrodes spacing;

the lower surface of the elastic adhesion layer is adhered to the flexible non-electrode region of the flexible printed circuit board, the upper surface of the elastic adhesion layer is adhered to a lower surface of the conductive elastic composite body; and the conductive elastic composite body is a block-shaped body structure. One surface of the block-shaped body structure facing the flexible printed circuit board is concaved inwards to form a pressure contact cavity region. The pressure contact cavity region directly faces the flexible electrode region of the flexible printed circuit board (FPCB), and an upper surface of the inner wall of the pressure contact cavity region can contact the two flexible electrodes in the flexible electrode region simultaneously or successively so as to switch on the circuit when being pressed.

A further technical scheme is as follows.

The flexible pressure switch further includes an elastic fastening element, the elastic fastening element is fixed on the outer circumferential wall of the conductive elastic composite body and on the flexible non-electrode region of the flexible printed circuit board, which makes the conductive elastic composite body and the flexible printed circuit board bonded together.

The conductive elastic composite body is formed by a conductive layer and an elastic body layer, wherein the conductive layer is arranged on a lower layer of the elastic body layer and can contact the two flexible electrodes in the flexible electrode region simultaneously or successively when the conductive elastic composite body is pressed.

The conductive layer has adjustable resistivity, and the conductive layer is composited with the elastic body layer through one way of laminating, coating, adhesion, injection molding and blending to form the conductive elastic composite body.

The elastic body layer is one of polyurethane resin, silicone rubber, polyacrylic resin or elastomeric copolymers.

A press block is formed outwards convexly on an outer wall of an upper surface of the conductive elastic composite body corresponding to the flexible electrode region, the cross section of the press block is one structure of rectangle, trapezoid, convex arc or irregular curve; the upper surface of the inner wall of the pressure contact cavity region of the conductive elastic composite body is one of the plane structure, zigzag structure, downward convex arc structure or irregular curved surface structure.

The elastic adhesion layer is one of adhesive tape, reactive adhesive and hot-melt adhesive, wherein the adhesive tape is one of solvent based adhesive tape, emulsion based adhesive tape, hot-melt adhesive tape, pressure sensitive adhesive tape, calendering adhesive tape and reactive adhesive tape; the reactive adhesive is one of silicone gel, toughened epoxy resin and polyurethane resin; and the hot-melt adhesive is a hot-melt block copolymer.

The elastic fastening element is formed by one of the acrylic resin, epoxy resin, unsaturated polyester resin, room temperature vulcanized silicone rubber or high temperature vulcanized silicone rubber through one process of dispensing, coating, adhesion or injection molding.

The disclosure further provides a fabrication method for a flexible pressure switch; the fabrication method includes the following steps:

(1) compositing a conductive layer and an elastic body layer adopting one way of laminating, coating, adhesion, injection molding and blending to form a conductive elastic composite body;

(2) adhering the conductive elastic composite body obtained in Step (1) to a flexible non-electrode region of a flexible printed circuit board using an elastic adhesion layer; and (3) exerting a downward normal pressure of certain amplitude and duration on the conductive elastic composite body to increase the adhesive strength among the conductive elastic composite body, the elastic adhesion layer and the flexible non-electrode region of the flexible printed circuit board.

A further technical scheme is as follows.

After Step (3), the method further includes a Step (4): compositing the material used for an elastic fastening element to the outer circumferential wall of the conductive elastic composite body and the circumferential ring of the flexible non-electrode region of the flexible printed circuit board adopting one process of dispensing, coating, adhesion or injection molding.

The beneficial technical effects of the disclosure are: the flexible pressure switch is simple in structure, small in size, light in weight, facile in fabrication process and stable in performance; the threshold of the conducting resistance is adjustable and the switching pressure threshold value is adjustable; the fatigue performance is excellent, which is at the level of million times; the flexible pressure switch is suitable for smart wearables such as smart insoles, smart shoes, smart seats, smart mattresses and the like.

Figure 1:
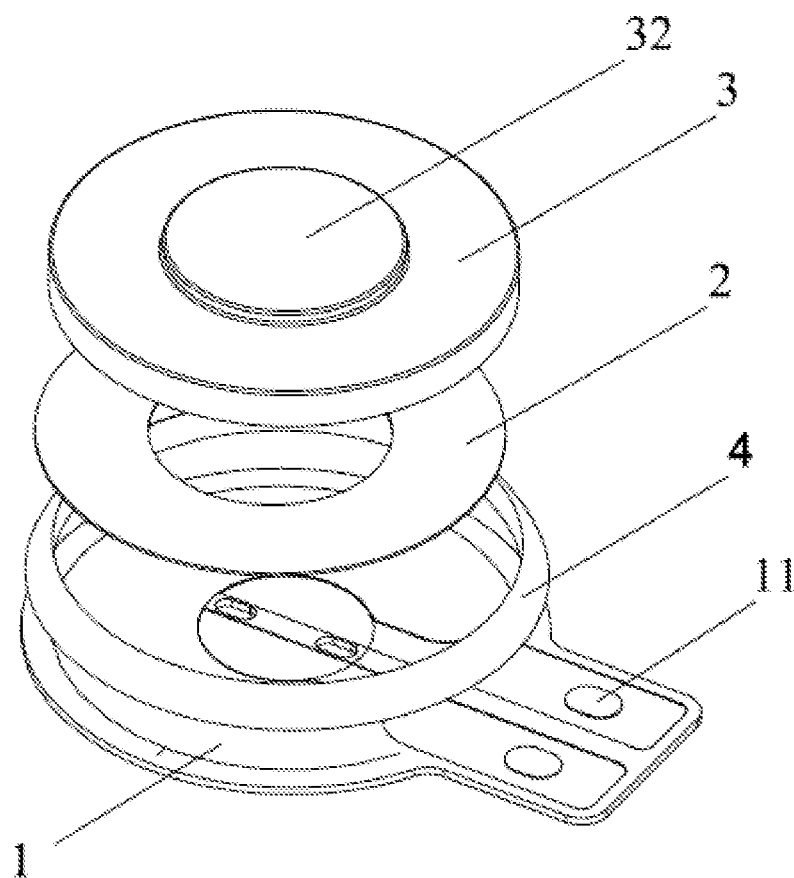
FIG. 1 is a diagram illustrating an exploded structure of a flexible pressure switch according to the disclosure.

In the drawings:
1 represents a flexible printed circuit board 11 represents a flexible electrode
2 represents an elastic adhesion layer 3 represents a conductive elastic composite body
31 represents a pressure contact cavity region 32 represents a press block
4 represents an elastic fastening element

DESCRIPTION OF THE EMBODIMENTS

To better understand the technical means of the disclosure, specific implementations of the disclosure are described below in further detail in conjunction with the drawings and specific embodiments and may be carried out according to the content of the disclosure; however, the following embodiments are used to illustrate the disclosure, but to limit the scope of the disclosure.

As shown in FIG. 1, the flexible pressure switch described in the disclosure mainly includes four parts, respectively being, a flexible printed circuit board 1, an elastic adhesion layer 2, a conductive elastic composite body 3 and an elastic fastening element 4, wherein the flexible printed circuit board 1, the elastic adhesion layer 2 and the conductive elastic composite body 3 are arranged in a cascading manner from the bottom layer to the top layer in sequence, and they are necessary constitution parts of the flexible pressure switch of the disclosure; the elastic fastening element 4 is fixed on the outer circumferential wall of the conductive elastic composite body 3 and on the flexible non-electrode region of the flexible printed circuit board 1, and makes the conductive elastic composite body 3 and the flexible printed circuit board 1 stuck together; the elastic fastening element 4 is not a compulsory part, that is, an optional part of the disclosure.

Figure 5:
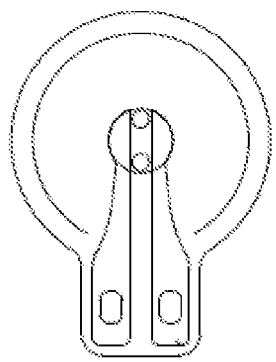
FIG. 5 is a diagram illustrating a structure of a flexible pressure circuit according to the disclosure.
Figure 5:
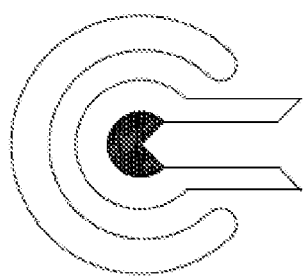
Figure 5:
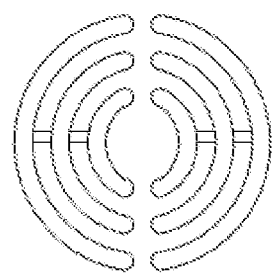
Figure 5:
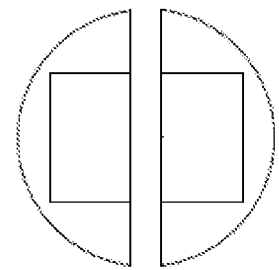
Figure 5:
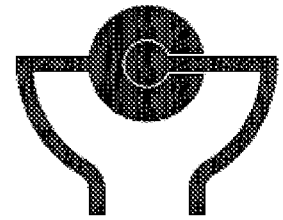
Figure 5:
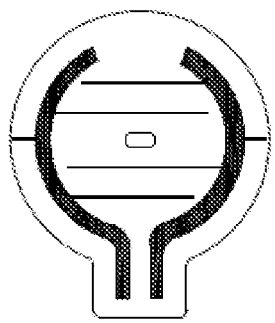

The flexible printed circuit board 1 is composed of a flexible electrode region and a flexible non-electrode region, two flexible electrodes 11 separated from each other are arranged in the flexible electrode region, the flexible electrode region has an adjustable resistivity and an adjustable flexible electrodes spacing, and the ON/OFF resistance threshold of the flexible pressure switch of the disclosure may be adjusted by changing the resistivity of the flexible electrode or the flexible electrodes spacing. The flexible printed circuit board may adopt any one of the flexible printed circuit boards shown in FIG. 5, preferably selecting the structure i shown in FIG. 5; the flexible printed circuit board includes but not limited to the structure shown in FIG. 5.

A lower surface of the elastic adhesion layer 2 is adhered to the flexible non-electrode region of the flexible printed circuit board 1, an upper surface of the elastic adhesion layer 2 is adhered to a lower surface of the conductive elastic composite body 3. The function of the elastic adhesion layer is to make the conductive elastic composite body 3 of the flexible pressure switch adhered to and located on the flexible non-electrode region of the flexible printed circuit board. Generally, the elastic adhesion layer is shaped in conjunction with the shapes of the lower surface of the conductive elastic composite body and the flexible non-electrode region, and generally is a cavate ring shaped structure. The elastic adhesion layer 2 is one of adhesive tape (generally adopting double sided adhesive tape), reactive adhesive and hot-melt adhesive, wherein the adhesive tape is one of solvent-based adhesive tape, emulsion-based adhesive tape, hot-melt adhesive tape, pressure sensitive adhesive tape, calendering adhesive tape and reactive adhesive tape; the reactive adhesive is one of silicone gel, toughened epoxy resin and polyurethane resin; and the hot-melt adhesive is a hot-melt block copolymer. The elastic adhesion layer 2 in this specific embodiment preferably selects the pressure sensitive adhesive tape.

Figure 2:
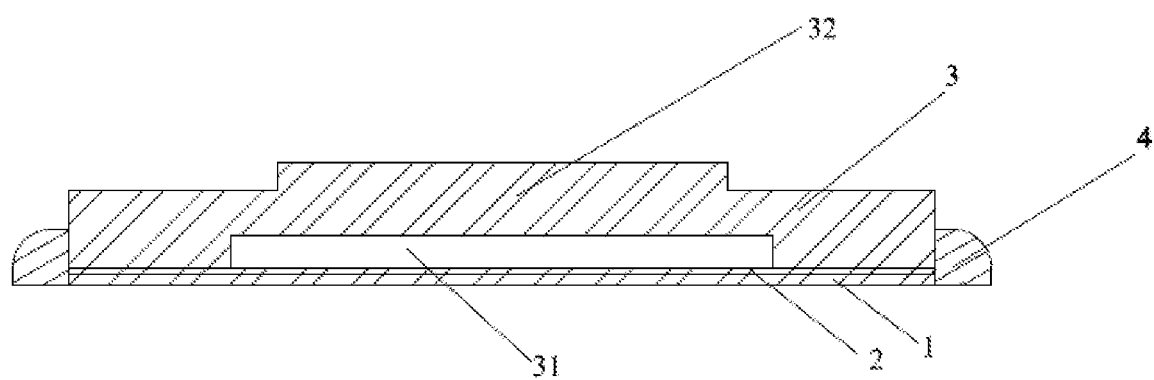
FIG. 2 is a diagram illustrating a cross-sectional structure of a flexible pressure switch in a non-pressed state according to the disclosure.
Figure 3:
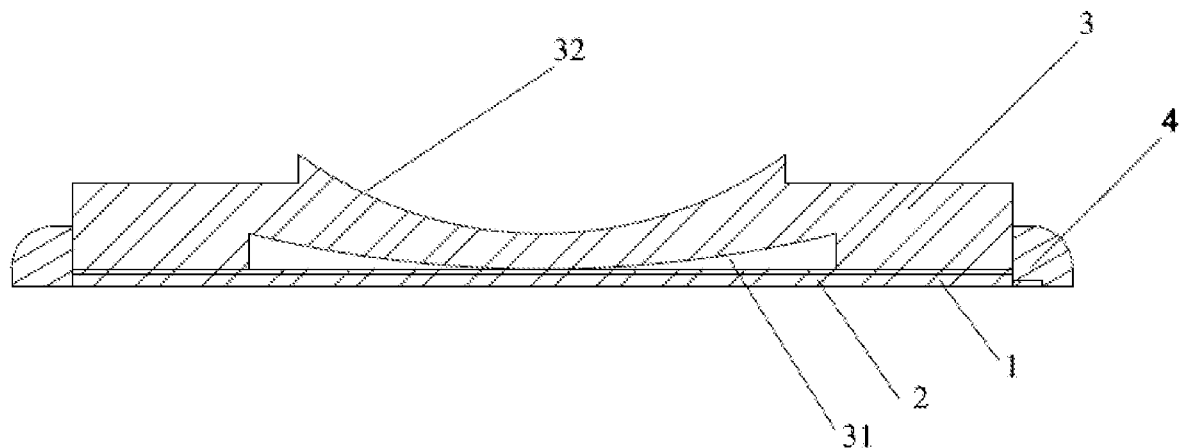
FIG. 3 is a diagram illustrating a cross-sectional structure of a flexible pressure switch in a pressed state according to the disclosure.
Figure 4:
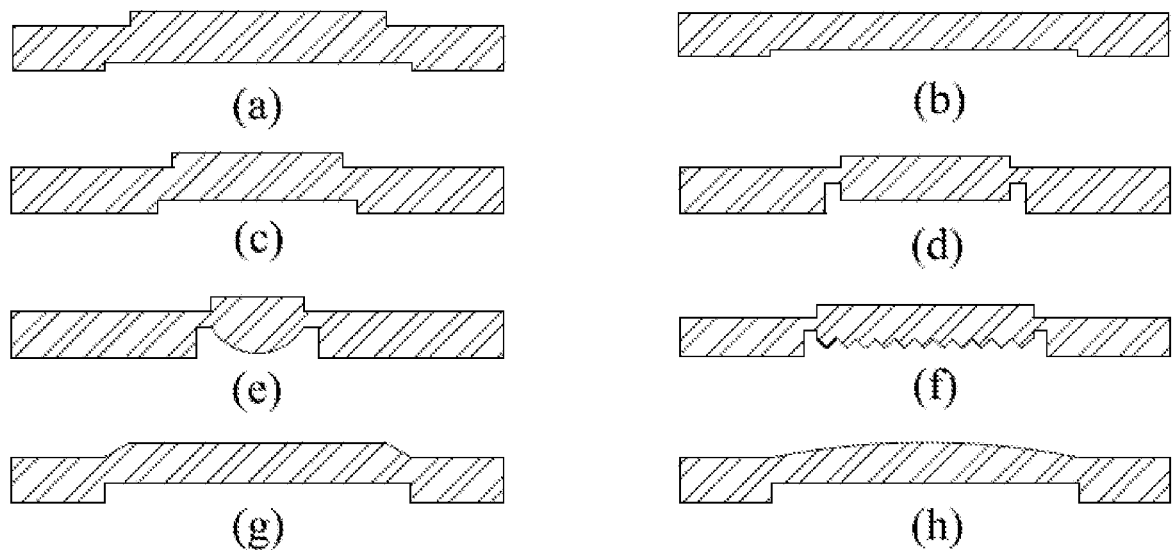
FIG. 4 is a diagram illustrating various cross-sectional structures of a conductive elastic composite body according to the disclosure.

The conductive elastic composite body 3 is formed by a conductive layer and an elastic body layer, wherein the conductive layer is arranged on a lower layer of the elastic body layer and can contact the two flexible electrodes in the flexible electrode region simultaneously or successively when the conductive elastic composite body is pressed. Herein, the elastic body layer is made by one of polyurethane resin, silicone rubber, polyacrylic resin or elastomeric copolymers. The elastic body layer made by the above materials has excellent rebound elasticity, fatigue performance and mechanical performance. The conductive layer has an adjustable resistivity; the conductive layer is composited with the elastic body layer through one way of laminating, coating, adhesion, injection molding and blending to form the conductive elastic composite body 3, so that part or the entirety of the elastic body layer has a conducting function. The conductive elastic composite body 3 is a block-shaped body structure, one surface of the block-shaped body structure facing the flexible printed circuit board 1 is concaved inwards to form a pressure contact cavity region 31, the pressure contact cavity region 31 directly faces the flexible electrode region of the flexible printed circuit board, and an upper surface of the inner wall of the pressure contact cavity region can contact the two flexible electrodes in the flexible electrode region simultaneously or successively so as to turn on the circuit when being pressed. A press block 32 is formed outwards convexly on an outer wall of an upper surface of the conductive elastic composite body 3 corresponding to the flexible electrode region, the cross section of the press block is one structure of rectangle, trapezoid, convex arc and irregular curve; the upper surface of the inner wall of the pressure contact cavity region 31 of the conductive elastic composite body 3 is one of plane structure, zigzag structure, downward convex arc structure and irregular curved surface structure. The conducting pressure value threshold of the flexible pressure switch may be adjusted through the structural design as shown in FIG. 2 and FIG. 3, the structural design preferably selects the structure as shown in FIG. 4 of the conductive elastic composite body 3, particularly, the shape on the upper surface of the inner wall of the pressure contact cavity region 31. The function realized by the conductive elastic composite body 3 is: when the conductive elastic composite body 3 is in a pressed state and the pressure reaches certain value, the conductive layer of the conductive elastic composite body 3 is in contact with the two flexible electrodes in the flexible electrode region simultaneously or successively so as to turn on the entire circuit.

The elastic fastening element 4 is not a compulsory part of the flexible pressure switch of the disclosure; however, in order to achieve a better performance, generally the elastic fastening element 4 is used in the flexible pressure switch. The function of the elastic fastening element 4 is to make the conductive elastic composite body and the flexible non-electrode region of flexible printed circuit board bonded together, thereby enhancing the shearing resistance, the shock resistance and the fatigue performance of the flexible pressure switch. In the disclosure, the elastic fastening element 4 is formed by one of acrylic resin, epoxy resin, unsaturated polyester resin, room temperature vulcanized silicone rubber or high temperature vulcanized silicone rubber through one process of dispensing, coating, adhesion or injection molding; preferably, the elastic fastening element 4 is formed by the room temperature vulcanized silicone rubber through one process of dispensing, coating, adhesion or injection molding.

The disclosure is mainly composed of the above four parts; in the condition that a pressure is exerted, the conductive layer of the conductive elastic composite body contacts the two flexible electrodes on flexible printed circuit board so as to turn on the circuit. The ON/OFF resistance threshold range of the flexible pressure switch is adjusted by changing the resistivity of the conductive layer or the flexible electrodes or the spacing between the flexible electrodes; the switching pressure value range of the flexible pressure switch is adjusted through the structural design of the conductive elastic composite body and the change of the hardness parameter of the conductive elastic composite body; the shearing resistance, shock resistance and the sealing performance of the flexible pressure switch are adjusted by changing the material of the elastic fastening element.

While the flexible pressure switch is used, in the process of pressing the flexible pressure switch, when the external pressure value is less than the conducting pressure value, the conductive layer of the conductive elastic composite body 3 and the flexible electrodes of the flexible printed circuit board 1 do not contact each other or, after contact, the resistance value is greater than the resistance threshold of the flexible pressure switch, then the flexible pressure switch is in the OFF state; when the external pressure value is more than or equal to the switching pressure value, the conductive layer of the conductive elastic composite body 3 and the flexible electrodes of the flexible printed circuit board 1 contact each other and the resistance value is less than or equal to the resistance threshold, then the flexible pressure switch is in the ON state; after the pressure force is removed, the conductive elastic composite body 3 is reset, and the pressure switch gets back to the OFF state.

A fabrication method for the above flexible pressure switch is described below in detail; the fabrication method includes the following steps:

(1) compositing a conductive layer and an elastic body layer adopting one way of laminating, coating, adhesion, injection molding and blending to form a conductive elastic composite body;

(2) adhering the conductive elastic composite body obtained in Step (1) to a flexible non-electrode region of a flexible printed circuit board using an elastic adhesion layer; and (3) exerting a downward normal pressure of certain amplitude and duration on the conductive elastic composite body to increase the adhesive strength among the conductive elastic composite body, the elastic adhesion layer and the flexible non-electrode region of the flexible printed circuit board.

In addition, when the flexile pressure switch needs an elastic fastening element, after Step (3), Step (4) is added: compositing the material used for the elastic fastening element to the outer circumferential wall of the conductive elastic composite body and the circumferential ring of the flexible non-electrode region of the flexible printed circuit board adopting one process of dispensing, coating, adhesion or injection molding.

The above are preferred implementations of the disclosure merely, but a limit of the disclosure. It should be noted that, for the ordinary staff in this art, multiple improvements and modifications can be made without departing from the principle of the disclosure, and these improvements and modifications shall fall into the scope of protection of the disclosure.

What is claimed is:

1. A flexible pressure switch, wherein the flexible pressure switch comprises a flexible printed circuit board, an elastic adhesion layer and a conductive elastic composite body that are arranged in a cascading manner from a bottom layer to a top layer in sequence, the flexible printed circuit board is composed of a flexible electrode region and a flexible non-electrode region, two flexible electrodes separated from each other are arranged in the flexible electrode region, and the flexible electrode region adjusts an ON/OFF resistance threshold of the flexible pressure switch through an adjustable resistivity or an adjustable flexible electrodes spacing;

a lower surface of the elastic adhesion layer is adhered to the flexible non-electrode region of the flexible printed circuit board, an upper surface of the elastic adhesion layer is adhered to a lower surface of the conductive elastic composite body; and the conductive elastic composite body is a block-shaped body structure, one surface of the block-shaped body structure facing the flexible printed circuit board is concaved inwards to form a pressure contact cavity region, the pressure contact cavity region directly faces the flexible electrode region of the flexible printed circuit board, and an upper surface of an inner wall of the pressure contact cavity region can contact the two flexible electrodes in the flexible electrode region simultaneously or successively so as to turn on a circuit when being pressed.

2. The flexible pressure switch according to claim 1, wherein the flexible pressure switch further comprises an elastic fastening element, the elastic fastening element is fixed on an outer circumferential wall of the conductive elastic composite body and on the flexible non-electrode region of the flexible printed circuit board, and bonds the conductive elastic composite body and the flexible printed circuit board together.

3. The flexible pressure switch according to claim 2, wherein the elastic fastening element is formed by one of polyacrylic resin, epoxy resin, unsaturated polyester resin, room temperature vulcanized silicone rubber or high temperature vulcanized silicone rubber through one process of dispensing, coating, adhesion or injection molding.

4. The flexible pressure switch according to claim 1, wherein the conductive elastic composite body is formed by a conductive layer and an elastic body layer, wherein the conductive layer is arranged on a lower layer of the elastic body layer and can contact the two flexible electrodes in the flexible electrode region simultaneously or successively when the conductive elastic composite body is pressed.

5. The flexible pressure switch according to claim 4, wherein the conductive layer has an adjustable resistivity, and the conductive layer is composited with the elastic body layer through one way of laminating, coating, adhesion, injection molding and blending to form the conductive elastic composite body.

6. The flexible pressure switch according to claim 4, wherein the elastic body layer is one of polyurethane resin, silicone rubber, polyacrylic resin or elastomeric copolymers.

7. The flexible pressure switch according to claim 1, wherein a press block is formed outwards convexly on an outer wall of an upper surface of the conductive elastic composite body corresponding to the flexible electrode region, a cross section of the press block is one structure of rectangle, trapezoid, convex arc and irregular curve; the upper surface of the inner wall of the pressure contact cavity region of the conductive elastic composite body is one of plane structure, zigzag structure, downward convex arc structure and irregular curved surface structure.

8. The flexible pressure switch according to claim 1, wherein the elastic adhesion layer is one of adhesive tape, reactive adhesive and hot-melt adhesive, wherein the adhesive tape is one of solvent-based adhesive tape, emulsion-based adhesive tape, hot-melt adhesive tape, pressure sensitive adhesive tape, calendering adhesive tape and reactive adhesive tape; the reactive adhesive is one of silicone gel, toughened epoxy resin and polyurethane resin; and the hot-melt adhesive is a hot-melt block copolymer.

* * * * *